(12) United States Patent
Cok et al.

(10) Patent No.: US 8,232,718 B2
(45) Date of Patent: Jul. 31, 2012

(54) TILED ELECTROLUMINESCENT DEVICE WITH FILLED GAPS

(75) Inventors: Ronald S. Cok, Rochester, NY (US);
John W. Hamer, Rochester, NY (US);
Michael E. Miller, Honeoye Falls, NY (US)

(73) Assignee: Global OLED Technology LLC, Herndon, VA (US)

( * ) Notice: Subject to any disclaimer, the term of this patent is extended or adjusted under 35 U.S.C. 154(b) by 258 days.

(21) Appl. No.: 12/432,795

(22) Filed: Apr. 30, 2009

(65) Prior Publication Data

US 2010/0277064 A1 Nov. 4, 2010

(51) Int. Cl.
*H01L 51/00* (2006.01)
*H05B 33/04* (2006.01)
(52) U.S. Cl. ..................................... 313/504
(58) Field of Classification Search ............ 313/504, 313/512, 112, 113; 349/73; 345/1.3
See application file for complete search history.

(56) References Cited

U.S. PATENT DOCUMENTS

| | | | |
|---|---|---|---|
| 5,838,405 A | 11/1998 | Izumi et al. | |
| 5,903,328 A * | 5/1999 | Greene et al. | 349/73 |
| 6,097,455 A | 8/2000 | Babuka et al. | |
| 6,384,529 B2 | 5/2002 | Tang et al. | |
| 6,498,592 B1 | 12/2002 | Matthies | |
| 6,624,570 B1 * | 9/2003 | Sano et al. | 313/506 |
| 6,873,380 B2 | 3/2005 | Matthies et al. | |
| 2002/0001051 A1 * | 1/2002 | Krusius et al. | 349/73 |
| 2002/0140629 A1 | 10/2002 | Sundahl | 345/1.3 |
| 2003/0010893 A1 * | 1/2003 | Matthies | 250/208.1 |
| 2003/0071566 A1 * | 4/2003 | Kwasnick et al. | 313/504 |
| 2004/0190579 A1 * | 9/2004 | Hayashibe et al. | 372/92 |
| 2007/0001927 A1 | 1/2007 | Ricks et al. | |

FOREIGN PATENT DOCUMENTS

| | | |
|---|---|---|
| EP | 1 557 891 A2 | 7/2005 |
| WO | 2006/027727 | 3/2006 |

* cited by examiner

*Primary Examiner* — Karabi Guharay
(74) *Attorney, Agent, or Firm* — Morgan, Lewis & Bockius LLP

(57) ABSTRACT

A tiled electroluminescent device that improves light-emission uniformity and reduces reflection from ambient light includes a first and a second electroluminescent device tile, a portion of the edge of the first device tile abutted with a portion of the edge of the second device tile leaving a gap between the first and second device tile edges, each device tile including a substrate, having an optical index and a level of transparency, and an electroluminescent diode for emitting light according to a distribution that is substantially Lambertian, whereby light is directed along an oblique angle to the surface of the substrate of the first tile and through the edge of the first device tile; and a filler located in the gap between the abutting edges of the first and second device tiles, the filler having an optical index and a level of transparency matched to the substrates.

11 Claims, 6 Drawing Sheets

TILED ELECTROLUMINESCENT DEVICE WITH FILLED GAPS

FIELD OF THE INVENTION

The present invention relates to area-emissive LED flat-panel devices including multiple tiles. Specifically, the present invention relates to improving light emission uniformity of EL flat panel display systems and reducing reflection from ambient light.

BACKGROUND OF THE INVENTION

Electronic display systems are commonly used to display information, especially information containing motion or providing interactivity. Typical display systems range in size from small displays used in mobile devices to very large displays visible to thousands of viewers. In general, larger displays are more expensive than smaller displays. Moreover, very large flat-panel displays (e.g. greater than approximately 3 meters in diagonal) cannot be made on a monolithic substrate. Such very large displays are typically made by either positioning individual point-source light-emitting diodes into a large backplane or by tiling smaller displays together. For example, video walls using multiple video displays are frequently seen in the electronic media. Alternatively, multiple projector systems used to create a large, tiled, high-resolution display are also available. Tiled flat-panel displays including a plurality of liquid crystal displays are also known. However, such displays typically have visible seams between the tiles, resulting in less than satisfactory image quality.

Various approaches to solving the problem of tile seams are described in the art. U.S. Pat. No. 5,838,405 entitled "Tiled Display Device" describes adhering multiple, adjacent LCD displays between a large substrate and a flexible coat layer. An adhesive agent is placed between the displays and both the large substrate and flexible coat layer which ideally has an optical matched to the large substrate, flexible coat layer, and the LCD panels to prevent trapping of light within the structure. Further, as the large substrate and flexible coat layer are attached to the LCDs, the adhesive agent fills the gaps between adjacent LCDs, preventing reflecting or scattering of light within this structure. Polarizer sheets are provided on both sides of the laminated LCD structure with orthogonal linear polarization. A monolithic backlight is provided behind the entire structure. In this structure, the presence of the adhesive agent between the LCD panels, sandwiched between the large substrate and flexible coat layer, limits optical surfaces between the large substrate and the flexible coat layer which can reflect or refract the light. Therefore, this adhesive agent provides the function of preventing reflection or refraction of light from the backlight as it passes between the two polarizing sheets to prevent loss of polarization. However, this adhesive agent must be sandwiched appropriately between the flexible coat layer and large substrate to achieve this function. In this configuration, because the light is polarized by a first polarizer and unaffected as it passes through this structure, the second polarizer will effectively absorb the light that passes from the backlight and through the gaps between adjacent LCD panels such that no light is emitted in the areas between the LCD panels. The transparency of this material is not discussed as its primary purpose is to insure that none of the light emitted by the backlight in the vicinity of the area between the tiles is passed through the device and therefore, this material can be opaque. Also, the filler of this scheme is UV curable and thus it must be possible to pass light into the device to cure the adhesive agent, which is disposed on both sides of and between the LCD tiles.

U.S. Pat. No. 6,097,455 entitled "Flat Panel Displays having Tiles and Visually Imperceptible Gaps There Between" also describes an LCD tiled structure. Adhesive layers together with LCD tiles and other optical components are located between a back substrate and a front cover plate. As discussed in this patent, masking elements are positioned over the tile gaps to prevent light from passing from the backlight into the gaps between the LCD panels. Once again, this configuration prevents light emitted from a backlight from emerging between the LCD panel tiles.

OLED display devices are also becoming popular and are employed in tiled display systems. Light emitting diodes (LEDs) incorporating thin films of light-emitting materials forming light-emitting elements have many advantages in a flat-panel display device and are useful in optical systems. U.S. Pat. No. 6,384,529 to Tang et al. shows an organic LED (OLED) color display that includes an array of organic LED light-emitting elements. Alternatively, inorganic materials are employed and can include phosphorescent crystals or quantum dots in a polycrystalline semiconductor matrix. Other thin films of organic or inorganic materials can also be employed to control charge injection, transport, or blocking to the light-emitting-thin-film materials, and are known in the art. The materials are placed upon a substrate between electrodes, with an encapsulating cover layer or plate. Light is emitted from a pixel when current passes through the light-emitting material. The frequency of the emitted light is dependent on the nature of the material used. In such a display, light is emitted through the substrate (a bottom emitter) or through the encapsulating cover (a top emitter), or both.

The optical structures of LCD tiled display systems are typically not well-adapted to the optical structures of area-emissive electroluminescent (EL) devices, such as Organic Light Emitting Diode (OLED) devices, since the use of cross polarizers and liquid crystals modulators within confined light pathways is fundamentally different from the direct modulation and emission of light from EL displays. In tiled LCDs, the light is emitted from a backlight and emitted between panels without being modulated by the LCDs within the tiles. However, in EL devices light is emitted within each tile and will not be emitted within an area between the tiles. Further, in LCDs, light from a backlight is directed perpendicular to the substrate as it passes through LCD panels. However, the angles of light entering the substrate of an EL device typically have a Lambertian distribution, that is, light is emitted equally in every direction at a plane that is very near the substrate surface. The light emitted within an EL device tile thus enters the substrate of an OLED traveling in all directions. Because EL devices employ high-optical-index emissive materials, which emit light into the substrate according to a near Lambertian distribution, a large fraction (e.g. greater than 50%) of the emitted light is typically trapped in the device due to total internal reflection and thus reduces the device efficiency. In particular, approximately the same amount of light is trapped in the device substrate as is emitted from the device. This light travels through the substrate and is emitted from the edge of the substrate.

Tiled display systems employing EL devices, specifically OLED displays are also known. U.S. Pat. No. 6,498,592 entitled "Display Tile Structure Using Organic Light Emitting Materials" describes a tiled display structure fabricated on a single substrate that also serves as a circuit board. However, this design requires that the inter-pixel distance be the same within a tile as between tiles. Ricks et al in U.S. Patent Application Publication No. 2007/0001927 describe overlapping tile elements for display that can be expanded, collapsed, folded, and rolled. However, such overlap area requires that a tile substrate be flexible and non-planar. WO 2006/027727 describes a tile electronic interconnection method. However, none of these disclosures address the issue of light leakage between tiles.

U.S. Pat. No. 6,873,380 entitled "Providing Optical Elements over Emissive Displays" describes an EL display formed of a plurality of abutted tiles, each tile contributing a portion of the overall displayed image. In this patent, optical elements are selectively situated between pixels to improve the optical performance of the display and can facilitate thicker cover glasses over the display. The disclosure describes the use of a black strip to absorb light between the tiles. The presence of this black strip prevents viewing of light that is emitted through the edges of each tile. Unfortunately, when a display is equipped with such barriers and then viewed at an angle, the absorber can obscure pixels on either side of the black strip, producing a perceptible seam at those angles.

There is a need therefore for tiled EL system that improves the light emission uniformity of EL flat panel display systems such that the appearance of the EL device is consistent both within and between tiles. Ideally, such a device will also provide reduced reflection from ambient light.

SUMMARY OF THE INVENTION

The need is met by a tiled electroluminescent device that improves light-emission uniformity and reduces reflection from ambient light, comprising:

(a) a first and a second electroluminescent device tile, a portion of the edge of the first device tile abutted with a portion of the edge of the second device tile leaving a gap between the first and second device tile edges, each device tile comprising a substrate, having an optical index and a level of transparency, and an electroluminescent diode for emitting light according to a distribution that is substantially Lambertian, whereby light is directed along an oblique angle to the surface of the substrate of the first tile and through the edge of the first device tile; and (b) a filler located in the gap between the abutting edges of the first and second device tiles, the filler having an optical index and a level of transparency matched to the optical index and transparency of the substrates of the first and second device tiles, whereby the light produced by the electroluminescent diode of the first device tile within the first range of oblique angles passes through the edge of the substrate of the first device tile, through the filler, and into the substrate of the second device tile before the light is absorbed or passes through an edge of the substrate of the second device tile and light produced by the electroluminescent diode of the first device tile within the second range of oblique angles passes through the edge of the substrate of the first device tile, through the filler, into the substrate of the second device tile before the light is emitted through the front surface of the substrate of the second device tile.

The present invention has the advantage that the boundaries between adjacent EL devices are less visible when viewed over a large range of viewing angles. An EL device according to the present invention is useful in dark viewing environments, in which the appearance is primarily affected by the light emitted from the device, and in environments with high ambient illumination, in which the appearance is additionally affected by reflected ambient light, and in which the present invention reduces reflections. The present invention can enable the tiling of multiple smaller EL devices into a single, large EL device with improved light emission uniformity, making the appearance of the EL device between tiles consistent with the appearance within tiles. This can enable high-quality, large EL devices for markets such as marketing and large venue communications.

Figure 1:
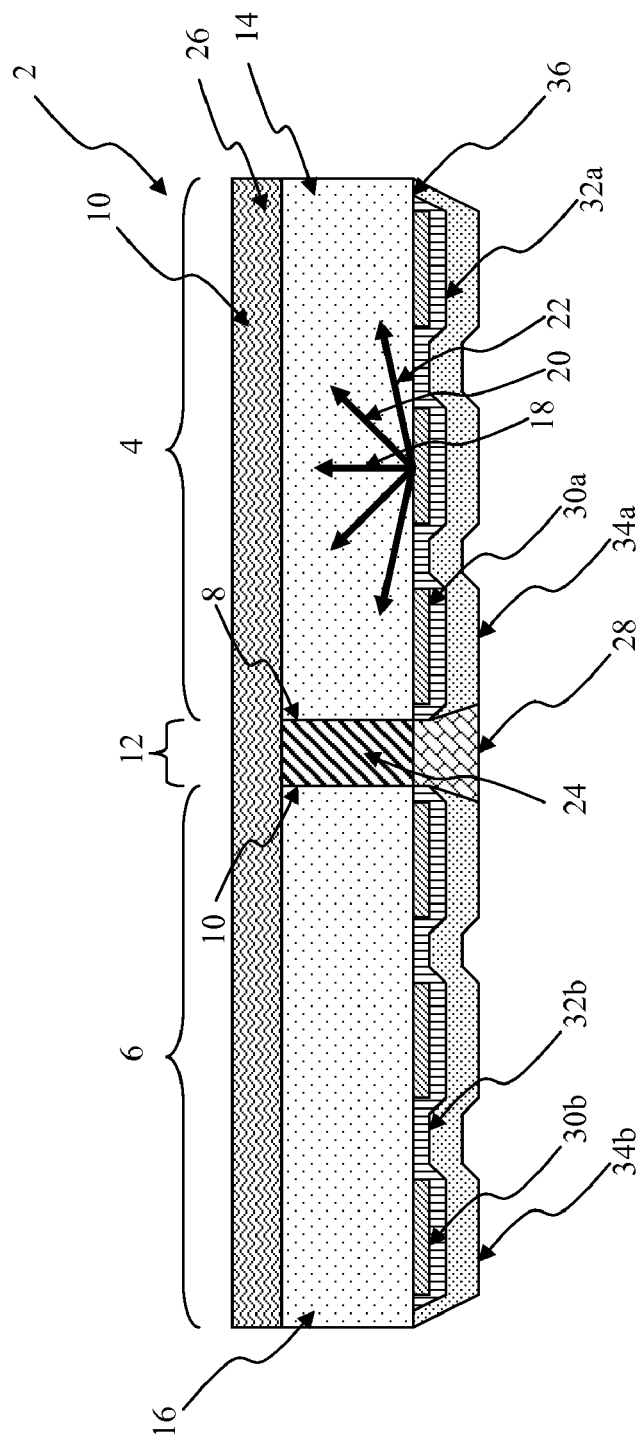
FIG. 1 is a cross-section of a tiled display according to an embodiment of the present invention.

Because the various layers and elements in the drawings have greatly different sizes, the drawings are not to scale.

DETAILED DESCRIPTION OF THE INVENTION

Referring to FIG. 1, the present invention provides a tiled electroluminescent (EL) device 2 having improved light-emission uniformity and reduced reflection from ambient light. The tiled electroluminescent device 2 includes at least a first 4 and a second 6 electroluminescent device tile. A portion of the edge 8 of the first device tile 4 is abutted with a portion of the edge 10 of the second device tile 6, leaving one or more gap(s) 12 between the first and second device tile edges 8, 10. Each device tile 4, 6 includes a substrate 14, 16, respectively, and at least one electroluminescent diode formed in optical contact with the substrate 14, 16 for emitting light according to a distribution that is substantially Lambertian. By "in optical contact" it is meant that the two materials are not separated by an air gap. As such light is permitted to enter the substrate from the electroluminescent diode and become trapped within this substrate due to total internal reflection between the surface of the substrate opposite the electroluminescent diode and a low index medium, such as air, that is in contact with the surface of the substrate opposite the surface on which the electroluminescent diode is formed. The substrates 14, 16 will each have an optical index and a level of transparency. As depicted in FIG. 1, the electroluminescent diode will generally include a first electrode 30a, 30b, e.g. an ITO electrode as known in the art, a coated light-emitting layer 32a, 32b, and a second electrode 34a, 34b. Although a single diode can be formed on each substrate, generally multiple diodes will be formed on each substrate. Because the light emitted from each of the diodes has a near Lambertian distribution and this light is produced very near a surface 36 of the substrate 14, light enters the substrate 14, 16 such that it is directed along a wide range of angles, including vectors 18, 20, 22.

Figure 2:
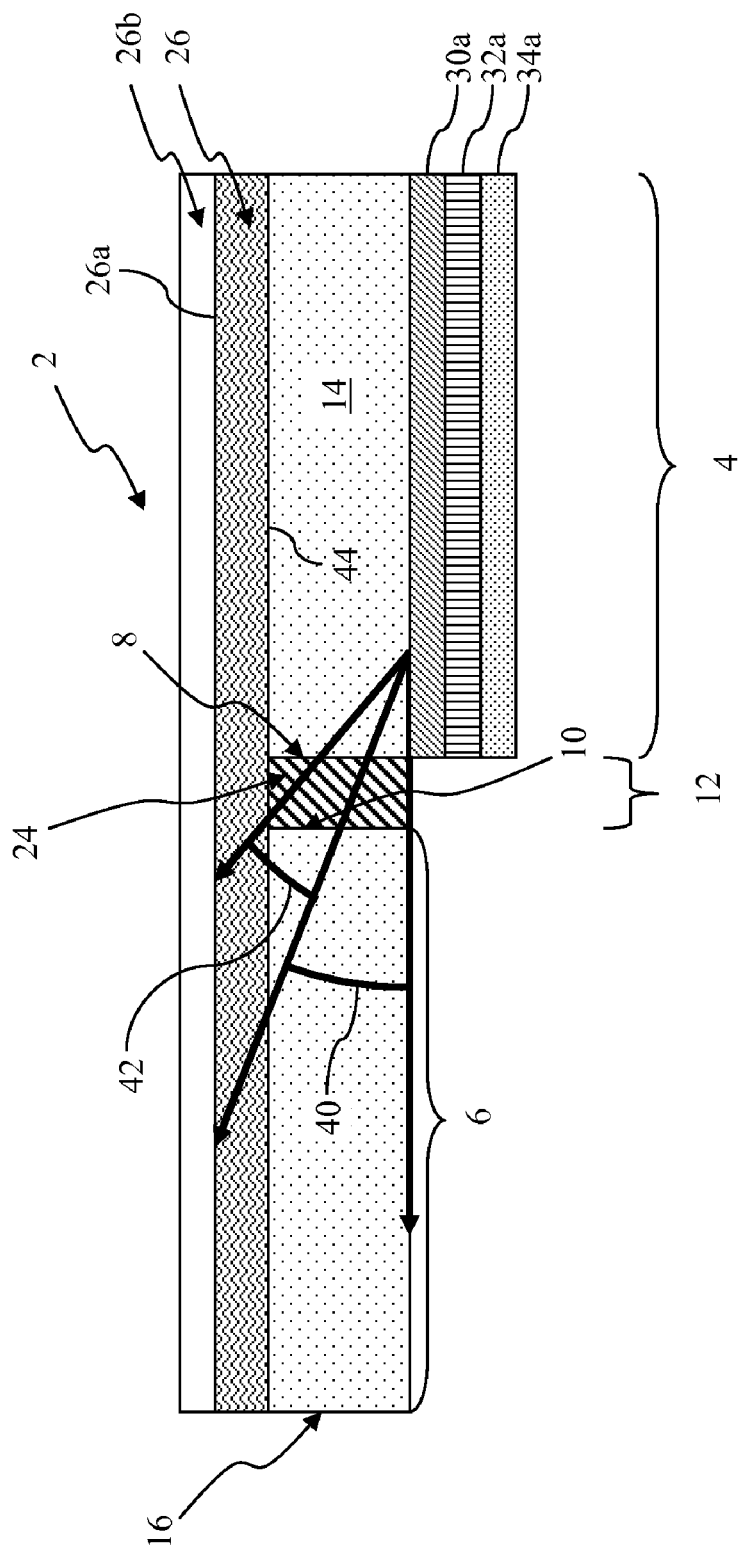
FIG. 2 is an illustration of the path of a ray of light emitted at a low angle with respect to the substrate surface according to one embodiment of the present invention.

As shown in FIG. 2, at least a portion of the light that is generated within the coated light-emitting layer 32a between first electrode 30a and second electrode 34a is directed along a first 40 and a second 42 range of angles that are oblique to a front surface 44 of the substrate 14 of the first device tile 4 and through the edge 8 of the first device tile 4. Other portions of this light will be emitted perpendicular to the surface of the substrate or at other oblique angles, for example light directed along vectors 18, 20 of FIG. 1 and pass through the front 44 or back surfaces of the substrate 14 of the first EL device tile 4. The substrates 14, 16 are abutted together along edges 8, 10 and affixed to a single super substrate 26. The super substrate 26 is located over a plurality of substrates of device tiles (e.g. substrates 14 and 16), and provides a surface for securing the plurality of substrates.

A filler 24 is located in the gap 12 between the abutting edges 8, 10 of the first 4 and second 6 device tiles. The filler 24 will have an optical index and level of transparency which is matched to the optical index and the level of transparency of the substrates 14, 16 of the first and second device tiles 4, 6, whereby the light produced by the electroluminescent diode of the first device tile 4 within the first range 40 of oblique angles passes through the edge 8 of the substrate 14 of the first device tile 4, through the filler 24, and into the substrate 16 of the second device tile 6 before the light is absorbed or passes through an edge of the substrate 16 of the second device tile and light produced by the electroluminescent diode of the first device tile 4 within the second range of oblique angles 42 passes through the edge 8 of the substrate 14 of the first device tile 4, through the filler 24, into the substrate 16 of the second device tile 6 before it is emitted through the front surface 44 of the substrate 16 of the second device tile 6.

Stating that the transparency of the filler 24 is "matched" to the transparency of the substrates 14, 16 requires that the transparency of the filler 24 be approximately equal to the transparency of the substrates 14, 16. Although the substrates are commonly formed from glass, which typically has a transparency of greater than 90 percent, the substrates can be formed from colored glass or other materials that have a lower level of transparency but that will still permit light to pass through them. Within the context of the present invention, the transparency of the filler 24 should be approximately equal to the transparency of the substrates 14, 16 and will preferably not have a transparency that differs from the transparency of the substrates by more than 10 percent. Preferably the filler 24 will have a transparency that is within 4 percent of the transparency of the substrates 14, 16. It is important that the transparency of the filler 24 be nearly equal to the transparency of the substrates 14, 16. However, it is not required that the transparency of the filler 24 match the transparency of the super substrate 26. The requirement that the transparency of the filler 24 match the transparency of the substrates 14, 16 arises from the fact that when emitting light, it is necessary for as much of the light that is created in one EL device tile within the second range of angles 42 and emitted such that it can pass into an abutted EL device tile to be passed through the filler 24 at the same proportion as it would be passed through a solid substrate. This matching of the transparency of the filler 24 with the transparency of the substrates 14, 16 permits light emitted in one EL device tile before entering an abutted device tile and exiting through the front surface 44 of this abutted device tile to have approximately the same intensity as light that is emitted with the same angle emitted from the first device tile 4 without encountering the edge 8 of the first device tile 4. Thus, this requirement improves the uniformity of the emitted light across the front surface of the tiled device tile.

Also, important in the present invention is the fact that because the optical indices of the substrates 14, 16 and the filler 24 are matched, the angle of the oblique light that encounters the edge 8 of the first substrate 14, which is in contact with the filler 24, remains relatively unchanged as it passes through the edge 6 of the first substrate 14, the filler 24 and the edge 10 of the second substrate 16, which is also in contact with the filler 24. Besides permitting light that would have escaped from the first substrate 14 to escape from the second substrate 16, this relationship is important for other reasons. An additional reason is illustrated in FIG. 2, which shows the first range of angles 40 in which light is created in the substrate 14 of the first device tile 4 on which the EL diode is formed. Light rays that are produced within this first range of angles 40 enters the substrate 14 at a low angle and thus passes through the edge 8 of the first device tile 4. Because the optical index of the filler 24 is equal to the optical index of the substrate 14 of the first device tile 4, the light ray is not refracted but passes into the filler 24 without obstruction and passes through the filler 24. Similarly because the optical index of the filler 24 is matched to the optical index of the substrate 16 of the second device tile 6, the light ray is not refracted when encountering the edge 10 of the substrate of the second device tile and enters the substrate 16, unobstructed. This light ray then enters the super substrate 26 provided the optical index of the super substrate 26 is matched to the optical index of the substrate 16. Super substrate 26 has a top surface 26a, which is the interface between the super substrate 26 and an adjacent material 26b, e.g. air. The optical index of the adjacent material 26b is lower than the optical index of the super substrate 26. The super substrate 26 thus has a critical angle with respect to the normal of super substrate 26. When the light ray encounters the top surface 26a of super substrate 26 at an angle above (farther from the normal than) this critical angle, it is reflected back into the device and travels the length of the device before exiting through an edge of the tiled EL device 6 such that the user does not view this light ray. Therefore light having angles of incidence that are above the critical angle of the top surface 26a of the super substrate 26 will be trapped in the second substrate 16 and will not be emitted from either the substrates 14, 16 of first or second EL device tiles 4, 6 near the location of the gap 12.

Figure 3:
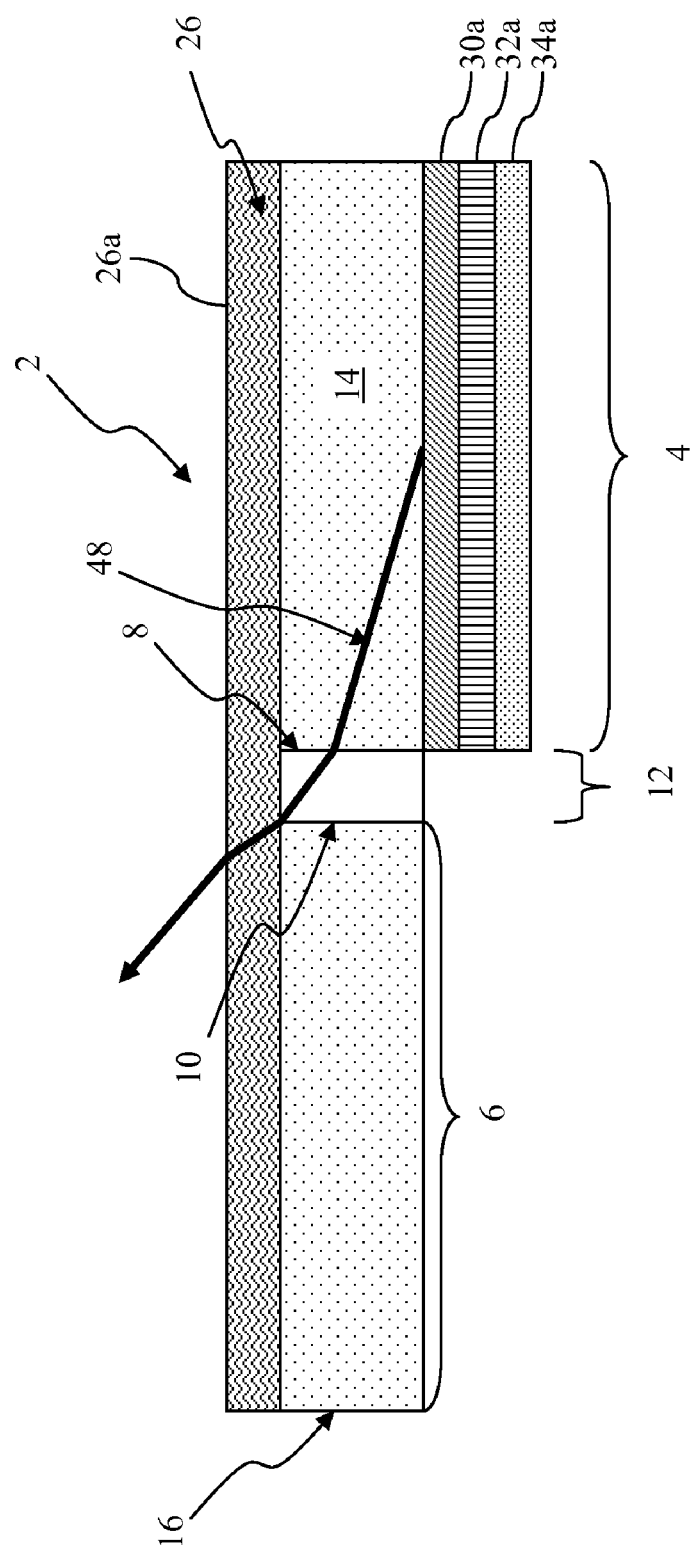
FIG. 3 is an illustration of the path of a ray of light emitted at the same low angle with respect to the substrate surface according to a prior-art embodiment.

The trapping of light that is emitted at a low angle with respect to the surface of the substrate 14 of the first EL tile 4 on which the EL diode is formed within the tiled EL device differs from devices of the prior art in which the gap is filled with air. Referring to FIG. 3, a prior-art device is shown in which the gap 12 is filled with a material, such as air, which has an optical index that is not matched to the optical index of the substrates 14, 16. As shown in FIG. 3, when a light ray 48 is emitted from the electroluminescent layer 32a of this device between first electrode 30a and second electrode 34a in the same way and at the same angle as a light ray within the first range of angles 40 as described in the previous paragraph, the angle of the oblique light is changed as it passes through edge 8 of the first substrate 14. This change in angle is large enough that the light ray does not encounter the edge of the second substrate as shown but instead encounters the super substrate 26. In this example, the ray of light 48 is again refracted as it enters the super substrate 26, and encounters the top surface 26a of the super substrate 26 at such an angle that the light ray is permitted to escape from the super substrate 26. Therefore, a user can perceive the light ray originating within the device near the location of the gap 12. Even if the angle of the light ray is such that it enters the second substrate 16, it is still altered as it passes into and out of the gap 12. Therefore, the light ray 48 is likely to escape the second substrate 16 and be perceived by the user as emanating from the device in the region of the gap 12.

In EL devices of the present invention, a significant portion of the light emitted from the EL diodes is trapped within the substrate due to total internal reflection. Therefore, the light which escapes from the tiled EL device in response to changes in the angle of light due to changes in optical index at the edges of the substrates is much greater than the light that is emitted at other locations within the tiled EL device. This change in optical index causes the appearance of bright lines within the displayed image. By placing the filler 24 in the gap 12 having an optical index matched to the optical index of the substrates, light that is trapped within the substrate of a device can escape from the device as though the gap did not exist.

The tiled EL device 2 can also include a super substrate 26, which is disposed over and attached to the substrates 14, 16 of the first 4 and second 6 device tiles to form the tiled electroluminescent device 2. The super substrate 26 will preferably be formed from a flexible material and will be adhered to the top of the substrates 14, 16, using an epoxy or adhesive having an optical index matched to the optical index of the super substrate and the optical index of the substrates. This super substrate 26 can block ultraviolet (UV) light from entering the device. In some embodiments, this super substrate 26 is formed from a flexible substrate, which absorbs or reflects light at wavelengths below 380 nm. For example, the super substrate 26 can be made from materials such as Polyethylene 2,6-napthalate (PEN). This UV blocking layer can preferably also serve to reduce reflection of ambient light from the tiled EL device 2.

The need for the super substrate 26 to be UV-blocking arises from two separate requirements. First, many EL materials, including organic light emitting diode (OLED) materials are sensitive to UV light. This light can cause photoluminescence of the material, which is particularly undesirable when the tiled EL device is a display, as each EL diode in the device can produce photoluminescence, increasing the black level of the diodes, and reducing the contrast of the display. UV exposure of these EL materials is also undesirable as it can cause the materials within these devices to decay, reducing the effective lifetimes of the material. Secondly, and most importantly for the present invention, the filler 24 will typically be formed from a polymeric material and these polymeric materials typically decay in the presence of UV light such that UV light causes the material to begin to reflect light in the green to red portions of the visible spectrum. As these materials "yellow" due to this decay, they lose transparency, becoming more opaque. This "yellowing" therefore reduces the effectiveness of the filler 24 within the present application and can introduce visibly dark bands when viewing the tiled EL device off axis because the light within the second range 42 of oblique angles will be filtered by this filler 24 more than it is filtered by the substrate, reducing the intensity of light that is emitted within the second range 42 of oblique angles.

In one specific example, the EL diode can include the reflective second electrode 34a, 34b to form a reflective element disposed opposite to the electroluminescent diodes from the substrate. In this embodiment, the super substrate 26 is a circular polarizer. Known circular polarizers provide the UV blocking function and additionally reduce reflection from ambient light. In a configuration with a polarizer and having a reflecting element, light, which enters the tiled EL device 2 from the ambient environment, will be circularly polarized as it enters the substrate. It can then be transmitted through the substrates 14, 16, into the EL diode and reflected from the second electrode 34a, 34b before passing out of the EL diode, through the substrate 14, 16 and encountering the super substrate 26 for a second time where it will be absorbed by the circular polarizer. In embodiments of the present invention, ambient light can alternately pass through the circular polarizer, where it is polarized, through the edge 8 of the first device tile 4, through the filler 12, and into the second device tile 6 before entering an EL diode and be reflected from the second electrode 34b of the second device tile 6 or it is reflected and then pass through the edge of the first device tile 8, through the filler 24, and into the second device tile 6. In either case, because it is reflected, the polarization of the light will not be modified as it passes through the device and the light will be absorbed when it encounters the circular polarizer. In devices of this type, it is desirable to form a reflective element 28 over the filler 24 in optical contact with the filler 24 on the same side of the tiled EL device as the EL diode, as such the reflective element 28 can reflect light that passes through the filler 24, as shown in FIG. 1.

Within embodiments of the present invention, it is desirable for the optical index of the super substrate 26 to be matched to the optical index of the substrates 14, 16 as well as the filler 24 to prevent the trapping of light at the interface between the super substrate 26 and the substrates 14, 16, and filler 24. It is not required that the transparency of the super substrate 26 be matched to the transparency of the substrates 14, 16 or the filler 24.

Within this disclosure the term "oblique angle" is any angle that is not perpendicular with respect to the surface of the substrate that is in contact with one or more EL diodes. This surface will typically be the surface of the substrate having the largest area. Of particular interest in the current invention is light that is emitted at low angles with respect to the surface of the substrate on which the EL diodes are formed, such that the light will not be emitted through the surface of the substrate opposing the EL diodes but instead will encounter the edge of the substrate that is abutted with the edge of another substrate. The range of oblique angles having this property will depend specifically on the thickness of the substrate. To be useful, the substrates of the present invention should have a finite thickness and will generally have a minimum thickness of 0.1 mm, but more commonly will have a thickness of between 0.5 and 1.0 mm, although the present invention will have greater value for devices having substrates with a thickness greater than 1.0 mm.

Within the present invention, the term "abutted" is defined to specify physically locating two substrates such that a portion of an edge of one substrate is in close proximity to a portion of an edge of a second substrate. At least one surface of each substrate is desirably in a common plane. These two substrates can be in physical contact at some locations along the proximally located edge portions, however, this is not required. In fact, it is required that at least some gap exists between the proximally located edge portions.

Within the present invention, the term "unobstructed" is used to describe the passage of light through the edges of the substrates. Within the present invention, it is recognized that it will be difficult to remove all air voids from the gap when depositing the filler between abutted tiles and that it will be difficult to exactly match the optical index of the filler to the optical index of the substrates. Therefore, it is possible that a small amount of refraction can occur. Within the present invention, the term "unobstructed" will be defined such that on average, the angle of light will not be altered by more than 10 degrees when encountering the edge of a substrate. As used in the current disclosure, when the optical index of the filler is "matched" to the optical index of the substrate, light rays passing through an interface between the two materials will not undergo a significant amount of refraction and will pass unobstructed between the two materials.

Figure 5:
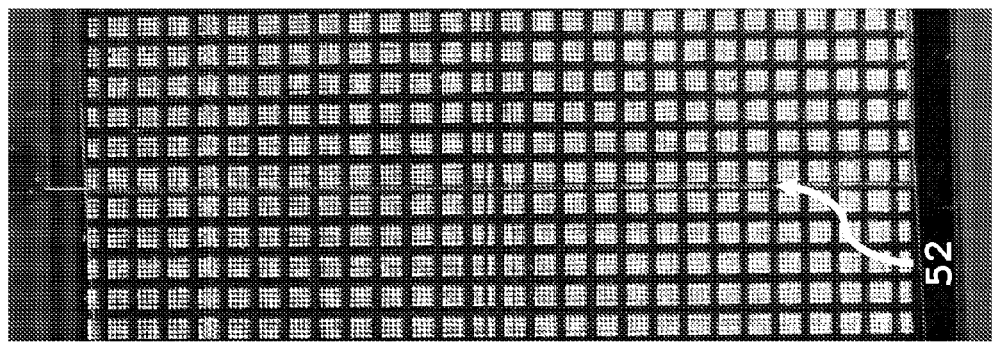
FIG. 5 is a representation of a photograph of a tiled EL device of an embodiment of the present invention showing a uniform light emission in the area of the gap between two substrates.
Figure 4:
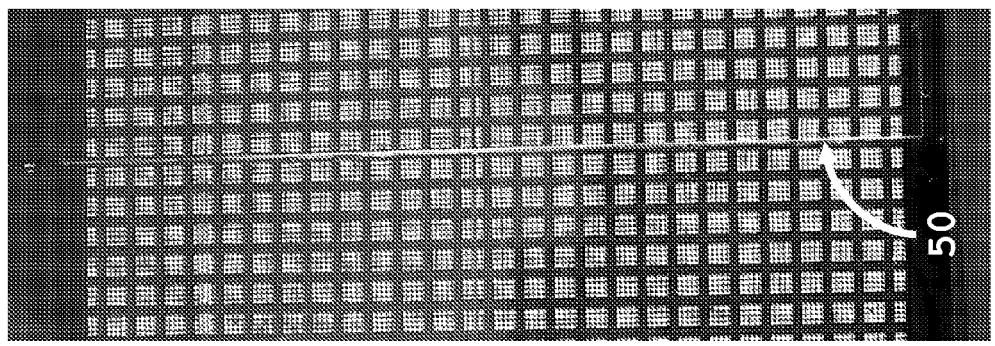
FIG. 4 is a representation of a photograph tiled EL device showing a bright line of emitted light near the gap between two substrates separated by air.

To illustrate the utility of the present invention, FIG. 4 shows a representation of a photograph of a display including two substrates abutted together with a gap filled with air. As shown in this image, there is a visible vertical line 50 in the region of the air gap. When viewing this tiled EL display, this bright vertical line can appear as a single bright line or a pair of bright lines at different viewing angles and, although it is visible from almost any angle, it is often more visible at some angles than other angles. FIG. 5 shows an image of the same display when liquid benzyl alcohol is used to fill the gap between the substrates. Benzyl alcohol has an optical index of 1.54, which is near the optical index of the glass substrate (e.g. 1.5). Note that the transparency of the substrates within this example is near 100%, as is the transparency of the Benzyl Alcohol. Although this fluid does not fill the gap fully, it limits the visibility of this bright line as shown by indicating a location 52 of the gap. As shown in this image a line is now only slightly visible in the location 52 of the gap in FIG. 5. It has been experimentally observed that at some angles this bright line is completely eliminated. Further experimentation included placing a circular polarizer in optical contact with the top of the substrates. In this configuration, the line 50 shown in FIG. 4 remains clearly visible when there is an air gap between the substrates. However, placing the circular polarizer over the substrates and the dispensing benzyl alcohol between the substrates made the bright line invisible: the two substrates appeared as a single display without any tiling defects. Note that filling the gap according to the present invention can provide significant benefit even if the filler does not fully fill the gap between the substrates or the surfaces of the filler are not perfectly flat.

Although the gap in the previous example was filled with benzyl alcohol, similar results can be obtained by filling the gap with various materials having an optical index and a transparency matched to the optical index and transparency of the substrates. Appropriate materials will be obvious to those skilled in the art.

In EL device tiles that employ a reflective surface behind the EL emitting layer 32a, 32b (FIG. 1), the use of the circular polarizer does little to affect the direction of the light rays as they pass from the EL diode through the filler 24. The circular polarizer does, however, reduce the visibility of reflected light from the ambient environment by preventing light that enters the display from the environment, passes through the substrates 14, 16, and into the EL diode from reflecting from the surface when it returns through the substrates 14, 16 without experiencing refraction. When this environmental light is reflected from the reflective surface within or behind the EL diode, it can travel back through the substrates 14, 16 and encounter the circular polarizer a second time, at which time it is absorbed. Without the filler 24 in the gap 12 between the substrates 14, 16, the light is refracted as it passes through the gap 12 between the substrates 14, 16 and the polarization of this ambient light is altered. Therefore, the effectiveness of the circular polarizer together with the reflective surface for eliminating ambient light is reduced. According to an embodiment of the present invention, the combination of the circular polarizer together with a reflective surface behind the EL light-emitting layer and a filler between the substrates which has an optical index matched to the optical index of the substrates, prevents the reflection of much of the ambient light from the tiled EL device.

In some embodiments, particular embodiments in which the gap 12 between the substrates 14, 16 is relatively large (i.e., has a physical width larger than the smallest dimension of one of the EL diodes), it is sometimes useful to place the reflective element 28 over the filler 24 as this will prevent light from passing from behind the display through the gap 12 to the front of the display, reflect light produced in side the EL tiles that encounters this area towards the front of the display, and reflect ambient light similarly to the reflective area behind the EL diode. However, it is not required that any layer be placed in contact with the filler 24 on the side of the tiled EL device disposed opposite to the super substrate 26.

In devices employing glass or transparent acrylic as substrates 14, 16 materials useful in forming the filler 24 generally include fluids that are cured after deposition into the gap between the substrates 14, 16. This fluid should generally have a viscosity somewhere between 1 and 1000 centipoise to permit it to fill the gap 12 between abutted portions 8, 10 of the edges of the first and second device tiles 4, 6. This fluid preferably will be an adhesive that is cured with optical exposure, including UV or visible light exposure and heat. It is useful for this material to be curable using visible light or heat since this light or heat can be provided directly by the EL device tiles and exposure to external heat and UV light are known to cause decay in certain EL materials, particularly organic light emitting materials. After curing the optical index of the material should be nearly equal to the optical index of the substrates, preferably between 1.4 and 1.6 and more preferably between 1.48 and 1.55. Known materials that can be used to form this filler 24 include Multi-Cure OP-24 RevB optical adhesive, Ultra Light-Weld OP-29V Series optical adhesives and Ultra Light Weld OP-4-20632 Series UV/Visible light curable optical adhesives made by Dymax. Other useful materials are available from other makers, including Master Bond, who produces UV 17-7LRI which is an optically clear UV curable polymer, non-yellowing adhesive. These materials all have indices of refraction between 1.48 and 1.55.

Referring back to FIG. 4, the width of the visible vertical line 50 is dependent upon the thickness of the substrate 14, 16. Therefore, the use of the filler 24 is particularly useful for thick substrates and for tiled EL devices having small EL diodes. FIG. 7 shows two substrates 14, 16 of the present invention. These substrates 14, 16 have a thickness 76. Generally, the thickness 76 of these substrates 14, 16 will be between 0.5 and 1.0 mm, but these substrates 14, 16 are much thicker within certain embodiments. As the thickness 76 of these substrates 14, 16 is increased, the visible vertical line 50 can increase in thickness and therefore be more visible when viewed from close distances. It is also important for the tiled EL device to be particularly absent of flaws when the EL diodes that are formed in the device are small. For instance, in a process described in FIG. 6, an array of EL diodes 72 are formed on each substrate to form an EL display device. These EL diodes have dimensions, for example 74, which are defined by the segmentation of the electrodes (i.e., 30a, 30b, 34a and 34b in FIG. 1). FIG. 7 shows a cross section of the EL device tiles through the smallest dimension of the EL diodes 72, such that the dimension 74 is the smallest dimension of the EL diodes 72 on each of the EL device tiles and in the resulting tiled EL device. The embodiment of the present invention is particularly useful when the ratio of the substrate thickness 76 to the smallest dimension of the EL diodes 72 is relatively large. Specifically, it is particularly desirable that the filler 24 be placed between the substrates 14, 16 anytime the electroluminescent diodes has a minimum dimension that is less than five times the thickness of the substrate.

Figure 6:
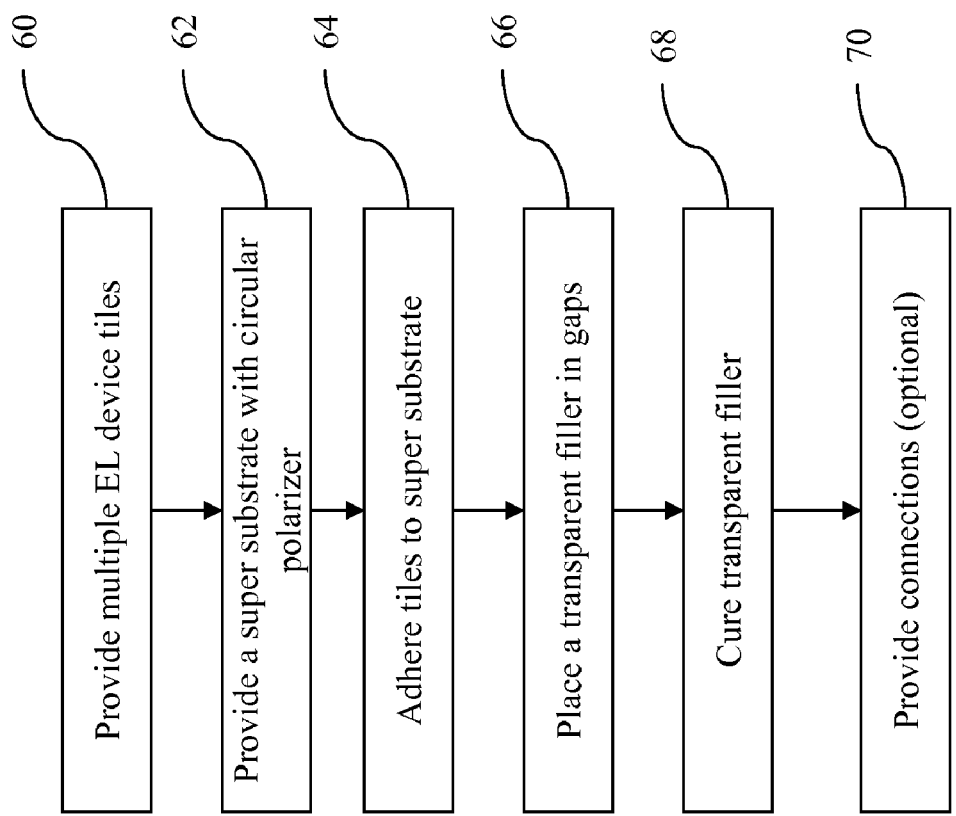
FIG. 6 is a flow diagram depicting a method for forming a tiled EL device of the present invention.
Figure 7:
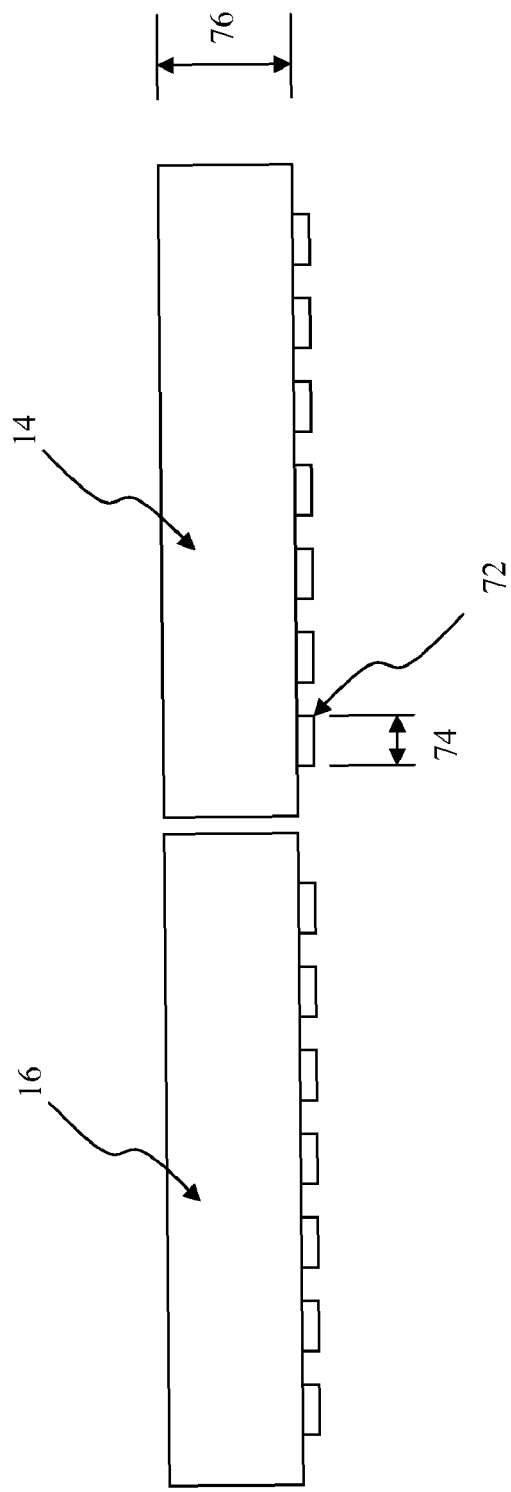
FIG. 7 is an illustration of an embodiment of the device tiles of the present invention.

A method of forming a tiled electroluminescent device of the present invention can include the steps shown in FIG. 6. As shown, this method can include providing 60 a plurality of EL device tiles, each device tile includes a substrate having an optical index and an electroluminescent diode for emitting light according to a distribution that is substantially Lambertian, whereby light is directed along an oblique angle to the surface of the substrate of the first EL tile and through the edge of the first device tile. A super substrate is provided 62 that is larger than any one of the EL device tiles. Adhering 64 the EL device tiles to the super substrate so that a portion of the edge of the first device tile is abutted with a portion of the edge of the second device tile such that a gap is formed between the first and second device tile edges. Placing 66 a filler between abutted edges of the EL device tiles, the filler having an optical index matched to the optical index of the substrates within each device tile and curing 68 the filler. Connections are optionally provided 70.

Within this method, the super substrate is a circular polarizer within some embodiments. In some embodiments, the EL device tiles are mounted on the transport sheet, a curable fluid is placed between the abutted edges of the EL device tiles and cured to form the filler before applying the super substrate by laminating it to the device tiles. In alternate embodiments, the EL device tiles are laminated to the circular polarizer, then the curable fluid is placed between the device tile abutted edges, and the curable fluid is cured to provide the filler.

Included in a method of forming the tiled EL device according to a method of the present invention, electrical connections are provided 70 between each of the device tiles and appropriate drive electronics. Because the EL diodes are not, necessarily, covered by a protective sheet, the electrical connections on each EL device tile should be accessible after the EL device tiles are attached to the super substrate and the filler is formed between the substrates. Therefore, these connections are often formed after assembly of the tile EL device of the present invention. In some embodiments, particularly for OLED devices, it is necessary to provide an additional protective barrier to protect the electrical connections or provide additional physical protection to the EL device. A cover is thus provided over the tiled EL device disposed on the side opposite to the super substrate. This cover is often attached to the edges of the tiled EL device or be brought into contact with the tiled EL device at numerous points, such as at the corners of the EL device tiles or over the entire seams between the device tiles and connected to provide additional physical protection. In these devices, the reflective element 28 will provide a hermetic seal between the two substrates and this additional protective barrier will preferably provide a nearly hermetic seal over the entire tiled EL device. This near hermetic seal can be provided by placing, for example, a stainless steel cover over the EL diodes of the tiled EL device and providing a seal to the edges of the substrates of the substrates at the edge of the tiled EL device, providing external connections for electrical connections. Materials, including desiccants are often placed between the cover and the tiled EL device to further isolate the EL materials in the EL diode from moisture.

The invention has been described in detail with particular reference to certain preferred embodiments thereof, but it will be understood that variations and modifications can be effected within the spirit and scope of the invention.

PARTS LIST

2 a tiled EL device
4 a first EL device tile
6 a second EL device tile
8 edge of the first device tile
10 edge of the second device tile
12 gap between abutted device tiles
14 substrate of the first device tile
16 substrate of the second device tile
18 vector
20 oblique vector
22 oblique vector
24 filler
26 super substrate
26a top surface
26b adjacent material
28 reflective element
30a, 30b first electrode
32a, 32b coated EL light-emitting layer
34a, 34b second electrode
36 surface of the substrate
40 first range of oblique angles
42 second range of oblique angles
44 front surface of substrate
48 light ray
50 visible vertical line
52 location of gap
60 providing EL device tiles step
62 providing super substrate step
64 adhering EL device tiles step
66 placing filler step
68 curing filler step
70 providing electrical connections step
72 EL diode
74 dimension
76 substrate thickness

The invention claimed is:

1. A tiled electroluminescent device that improves light emission uniformity and reduces reflection from ambient light, comprising:
   (a) a first and a second electroluminescent device tile, a portion of the edge of the first device tile abutted with a portion of the edge of the second device tile leaving a gap between the first and second device tile edges, each device tile comprising a substrate, having an optical index and a level of transparency, and an electroluminescent diode for emitting light according to a distribution that is substantially Lambertian, whereby light is directed along an oblique angle to the surface of the substrate of the first tile and through the edge of the first device tile;
   (b) a filler located in the gap between the abutting edges of the first and second device tiles, the filler having an optical index and a level of transparency matched to the optical index and transparency of the substrates of the first and second device tiles, whereby the light produced by the electroluminescent diode of the first device tile within the first range of oblique angles passes through the edge of the substrate of the first device tile, through the filler, and into the substrate of the second device tile before the light is absorbed or passes through an edge of the substrate of the second device tile and light produced by the electroluminescent diode of the first device tile within the second range of oblique angles passes through the edge of the substrate of the first device tile, through the filler, into the substrate of the second device tile before the light is emitted through the front surface of the substrate of the second device tile; and
   (c) a super substrate disposed over the first and second device tiles and affixed to the substrates of the device tiles, wherein the super substrate is a circular polarizer selected to reduce reflection from ambient light; and
   (d) a reflective element located only in the gap between the abutting edges of the first and second device tiles on the same side of tiled EL device as the electroluminescent diodes that reflects light passing through the filler.

2. The tiled electroluminescent device of claim 1, wherein the super substrate blocks ultraviolet light from entering the tiled electroluminescent device.

3. The tiled electroluminescent device of claim 1, wherein the substrate of each electroluminescent device tile has a thickness and wherein each area-emissive electroluminescent diode device tile includes electroluminescent diodes each electroluminescent diode having a minimum dimension that is less than five times the thickness of the substrate.

4. The tiled electroluminescent device of claim 1, wherein the reflective element is disposed between the electroluminescent diodes.

5. The tiled electroluminescent device of claim 1, wherein the optical index of the filler is within 10% of the optical index of the substrate.

6. The tiled electroluminescent device of claim 1, wherein the substrate is transparent and the filler is transparent when cured.

7. The tiled electroluminescent device of claim 1, wherein the filler is formed from a heat or radiation cured fluid adhesive.

8. The tiled electroluminescent device of claim 1, wherein the electroluminescent diodes are each formed from organic materials.

9. The tiled electroluminescent device of claim 1, wherein the device tiles are identical.

10. The tiled electroluminescent device of claim 1, wherein the reflective element is in direct contact with the filler in the gap.

11. The tiled electroluminescent device of claim 1, wherein the gap has a physical width greater than the smallest dimension of one of the electroluminescent diodes.

* * * * *